(12) United States Patent
Matsuzaki et al.

(10) Patent No.: US 6,621,283 B1
(45) Date of Patent: Sep. 16, 2003

(54) SEMICONDUCTOR DEVICE, METHOD OF TESTING THE SEMICONDUCTOR DEVICE, AND SEMICONDUCTOR INTEGRATED CIRCUIT

(75) Inventors: Yasurou Matsuzaki, Kawasaki (JP); Masao Nakano, Kawasaki (JP); Toshiya Uchida, Kawasaki (JP); Atsushi Hatakeyama, Kawasaki (JP); Kenichi Kawasaki, Kawasaki (JP); Yasuhiro Fujii, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/437,221

(22) Filed: Nov. 10, 1999

(30) Foreign Application Priority Data

Jan. 13, 1999 (JP) ............................................. 11-007083

(51) Int. Cl.[7] .......................... G01R 31/02; G01R 31/26
(52) U.S. Cl. ....................... 324/763; 324/756; 324/765; 324/73.1
(58) Field of Search ................................ 324/763, 765, 324/158.1, 756, 73.1; 365/230.03, 189.01, 230.01; 438/17; 714/718, 744

(56) References Cited

U.S. PATENT DOCUMENTS

| | | | | |
|---|---|---|---|---|
| 4,833,395 A | * | 5/1989 | Sasaki et al. ................ 324/763 |
| 4,837,505 A | * | 6/1989 | Mitsunobu .................... 324/763 |
| 4,975,641 A | * | 12/1990 | Tanaka et al. ............... 324/763 |
| 5,528,162 A | * | 6/1996 | Sato ............................. 324/765 |
| 5,815,001 A | * | 9/1998 | Michael ....................... 324/763 |
| 5,943,285 A | * | 8/1999 | Kohno .................... 365/230.03 |
| 6,118,138 A | * | 9/2000 | Farnworth et al. ............ 257/48 |

FOREIGN PATENT DOCUMENTS

JP 10-188560 7/1998

* cited by examiner

*Primary Examiner*—Kamand Cuneo
*Assistant Examiner*—Paresh Patel
(74) *Attorney, Agent, or Firm*—Arent Fox Kintner Plotkin & Kahn, PLLC

(57) ABSTRACT

A semiconductor device mounted on a board or the like and having a test circuit, having the function of carrying out a contact test at a low cost on the terminals of the semiconductor, is disclosed. The semiconductor device comprises a terminal test circuit for testing a state of a contact of an external terminal and a test mode control circuit unit. The test mode control circuit unit outputs a signal indicating a first operation mode upon application of a power supply voltage thereto, outputs a test mode signal to the terminal test circuit in response to a control signal input to a specific terminal such as a chip select terminal, and outputs a signal indicating a second operation mode in response to the number of times in which the level of the control signal input to the specific terminal changes. Preferably, the first operation mode is a terminal test mode, and the second operation mode is a normal operation mode. A method of testing the semiconductor device and a semiconductor integrated circuit, having the test circuit, are also disclosed.

2 Claims, 11 Drawing Sheets

Fig.4

TABLE No.1

| | | | | | TEST INPUT | | | | | | | | TEST OUTPUT |
|---|---|---|---|---|---|---|---|---|---|---|---|---|---|
| A6 | A5 | A4 | A3 | A2 | A1 | A0 | DQM | /WE | /CAS | /RAS | CKE | CLK | DQ |
| 0 | 0 | 0 | 0 | 0 | 0 | 0 | 0 | 0 | 0 | 0 | 0 | 1 | 1 |
| 0 | 0 | 0 | 0 | 0 | 0 | 0 | 0 | 0 | 0 | 0 | 1 | 0 | 1 |
| 0 | 0 | 0 | 0 | 0 | 0 | 0 | 0 | 0 | 0 | 1 | 0 | 0 | 1 |
| 0 | 0 | 0 | 0 | 0 | 0 | 0 | 0 | 0 | 1 | 0 | 0 | 0 | 1 |
| 0 | 0 | 0 | 0 | 0 | 0 | 0 | 0 | 1 | 0 | 0 | 0 | 0 | 1 |
| 0 | 0 | 0 | 0 | 0 | 0 | 0 | 1 | 0 | 0 | 0 | 0 | 0 | 1 |
| 0 | 0 | 0 | 0 | 0 | 0 | 1 | 0 | 0 | 0 | 0 | 0 | 0 | 1 |
| 0 | 0 | 0 | 0 | 0 | 1 | 0 | 0 | 0 | 0 | 0 | 0 | 0 | 1 |
| 0 | 0 | 0 | 0 | 1 | 0 | 0 | 0 | 0 | 0 | 0 | 0 | 0 | 1 |
| 0 | 0 | 0 | 1 | 0 | 0 | 0 | 0 | 0 | 0 | 0 | 0 | 0 | 1 |
| 0 | 0 | 1 | 0 | 0 | 0 | 0 | 0 | 0 | 0 | 0 | 0 | 0 | 1 |
| 0 | 1 | 0 | 0 | 0 | 0 | 0 | 0 | 0 | 0 | 0 | 0 | 0 | 1 |
| 1 | 0 | 0 | 0 | 0 | 0 | 0 | 0 | 0 | 0 | 0 | 0 | 0 | 1 |
| ANY OTHER INPUT | | | | | | | | | | | | | 0 |

Fig.5

TABLE No.2

| TEST INPUT/OUTPUT | | | | | | | |
|---|---|---|---|---|---|---|---|
| DQ7 | DQ6 | DQ5 | DQ4 | DQ3 | DQ2 | DQ1 | DQ0 |
| 1 | 1 | 1 | 0 | 0 | 0 | 0 | 0 |
| 0 | 0 | 0 | 1 | 1 | 0 | 0 | 0 |
| 1 | 0 | 0 | 1 | 0 | 1 | 1 | 0 |
| 1 | 1 | 0 | 0 | 1 | 1 | 0 | 0 |
| 0 | 1 | 0 | 1 | 0 | 1 | 0 | 1 |

REMARKS)
 IN THIS CASE, INPUT DATA IS OUTPUT AS SUCH

SEMICONDUCTOR DEVICE, METHOD OF TESTING THE SEMICONDUCTOR DEVICE, AND SEMICONDUCTOR INTEGRATED CIRCUIT

BACKGROUND OF THE INVENTION

1. Field of the Invention

The present invention relates to a semiconductor device mounted on a board or the like having the function of carrying out a contact test at a relatively low cost to check a state of a contact of terminals of the semiconductor device, a method of testing the semiconductor device and a semiconductor integrated circuit.

In the process of mounting a semiconductor device consisting of a memory device such as a DRAM (dynamic random access memory) on a board or the like, it is important to confirm whether or not terminals of the memory device and terminals of the board are assuredly connected with each other by means of solder or the like, i.e., to carry out a contact check of the terminals of the memory device after the memory device is mounted on the board or the like.

Generally, a memory device such as a DRAM is packaged into a thin package of a surface mount type such as a TSOP (thin small outline package). The conditions of soldering of the terminals can be visually checked with these packages being mounted on the board, and therefore the contact check of the terminals of the memory device after the memory device is mounted on the board or the like, has thus far been carried out visually.

With a reduction of the size of a personal computer year by year, however, the packaging area of the memory device tends to decrease gradually. To meet the tendency toward the decrease in the packaging area of the memory device, in recent years a package having a smaller packaging area such as a CSP (chip size package) having substantially the same outer dimensions as a chip (1 cm square) has been fabricated. This type of package has a number of electrodes arranged in a matrix in the two-dimensional directions on the bottom thereof. Once the above type of package is mounted on the board, therefore, it is no longer easy to visually check the state of the contact of the terminals of the memory device.

2. Description of the Related Art

As described above, after packaging a memory device such as a DRAM into a package having a smaller packaging area (e.g., CSP) and mounting this particular package on a board, it is difficult to visually check the state of the contact of the terminals of the memory device. It is therefore necessary to carry out the contact check by actually activating the DRAM or the like. In the conventional method, a test circuit is prepared in which the contact check can be carried out by accurately setting the timing of associated signals. This method, however, unavoidably leads to the disadvantage of a relatively high cost for the contact check.

To cope with this disadvantage, a logic device such as a gate array is fabricated so as to include a simple test circuit therein for carrying out the contact check of the terminals by means of a boundary scan method which is usually practiced in the field of semiconductor device industry. The test circuit of this type requires no complicated setting of the timing of associated signals, and therefore the contact check of the terminals of the logic device can be easily carried out.

When carrying out the contact check with the above boundary scan method, or the like, described above, however, at least one additional terminal is usually required for activating the test circuit for contact check. In general, the logic device has many terminals (200 to 256 pins, for example) and is fabricated as a custom-made product based on a user's specification, and therefore at least one dedicated terminal can be easily provided for activating the test circuit for contact check.

However, in the case in which the test circuit for contact check of the logic device described above is to be applied to a memory device such as a DRAM, the following problems occur when activating the test circuit.

The memory device is often fabricated as a general-purpose product and usually designed with the minimum required number of terminals. For the memory device such as the DRAM, therefore it is difficult to provide any additional terminal that may be dedicated to the test circuit.

Further, in view of the need for carrying out the test for contact check with the memory device being mounted on the board, it is difficult to activate the test circuit by applying a specific voltage to a specific terminal.

In carrying out the contact check of the terminals of a semiconductor device consisting of a memory device such as a DRAM, therefore, a test circuit is required which can be activated by setting the timing of associated signals simply within the voltage range normally applied and also by utilizing existing terminals. On the other hand, such a test circuit must not be easily activated in the conditions of normal operations of the memory device, other than the conditions of the test for the terminal contact check, in order to prevent the test circuit from having an influence on the normal operations of the memory device.

SUMMARY OF THE INVENTION

The present invention has been developed in view of the above-mentioned problems, and the object thereof is to provide a semiconductor device including a test circuit which can be activated with a simple activation sequence without any dedicated terminal and, which is not easily activated in the condition of normal operations, a method of testing the terminals by utilizing the above test circuit or the like, and a semiconductor integrated circuit having the above test circuit.

In order to solve the problems mentioned above, according to the present invention, there is provided a semiconductor device comprising a terminal test circuit for testing the state of the contact of an external terminal; and a test mode control circuit unit for outputting a signal indicating a first operation mode when a power supply voltage is applied thereto, for outputting a test mode signal to the terminal test circuit in response to a control signal input to a specific terminal in the first operation mode, and for outputting a signal indicating a second operation mode in response to the number of times in which the level of the control signal input to the specific terminal changes.

According to another aspect of the present invention, there is provided a method of testing the terminals of a semiconductor device, comprising the steps of:

carrying out a first test by applying a power supply voltage to the power supply terminal of the semiconductor device and supplying a chip select signal of an active level to a chip select terminal in the semiconductor device thereby to check the state of the contact of the chip select terminal and the power supply terminal;

carrying out a second test by returning the chip select signal to an inactive level and then restoring the chip select signal to an active level, and activating a test circuit for checking the state of the contact any input terminals other than the chip select terminal thereby to check the state of the contact of the input terminals; and carrying out a third test by returning the chip select signal to an inactive level and then restoring the chip select signal to an active level, and activating the test circuit for checking the state of the contact of at least a data input/output terminal thereby to check the state of the contact of the data input/output terminal.

According to still another aspect of the present invention, there is provided a semiconductor integrated circuit comprising a first external terminal and a second external terminal each connected to an internal circuit; a test mode control circuit unit which is activated when a power supply voltage is applied thereto to output a test mode signal in response to a control signal applied to the first external terminal, and is deactivated when the logic level of the control signal changes the number of times equal to a predetermined value; and a terminal test circuit unit connected to the second external terminal to determine the state of the contact of the second external terminal in response to the test mode signal.

More specifically, in the semiconductor device and the testing method according to the present invention, the test circuit is activated asynchronously with a clock by switching on power and supplying the chip select signal to a specific terminal such as a chip select terminal, and the test circuit is automatically deactivated after supplying the chip select signal a predetermined number of times.

The test circuit is controlled by the chip select signal from the chip select terminal for the reason mentioned below.

Specifically, the chip select signal has the function of selecting only one memory device among a plurality of memory devices sharing a data bus on the board packaged with a plurality of the memory devices. By designing the semiconductor device so as to select one of the memory devices by means of the chip select signal and output the test result to the data bus from the data output terminal of the selected memory device, therefore, a test can be carried out independently for each memory device.

More specifically, the test is carried out on the memory devices mounted on the board in accordance with the following sequence (1) to (4).

(1) Upon application of a power supply voltage, a starter signal or the like is generated in a memory device whereby the memory device assumes the test mode.

(2) The chip select terminal in the memory device is set to a first level ("H" (high) level, for example) so that the memory device enters a non-select state.

(3) When the chip select terminal is set to a second level ("L" (low) level, for example) by being supplied with the chip select signal, the test circuit in the memory device is activated and the test is carried out.

(4) When the chip select terminal is set to the first level again, the test circuit is deactivated into a normal operation mode, and hereinafter, the test mode is not assumed.

In this case, the memory device has mounted thereon such a test circuit that the normal operation mode is assumed when detecting twice the fact that the test mode is assumed by the application of a power supply voltage and the chip select terminal is set to the first level.

In the case in which the terminals of the memory device are tested in a plurality of groups, on the other hand, the test is carried out in accordance with the following sequence (1) to (8). In this case, it is supposed that the test is carried out on three groups of terminals including the terminals of a first group (the chip select terminal and the power supply terminal), the terminals of a second group (any input terminals other than the chip select terminal) and the terminals of a third group (the data input/output terminal).

(1) Upon application of a power supply voltage, a starter signal or the like is generated so that the memory device assumes the test mode.

(2) The chip select terminal is set to the first level ("H" level, for example) so that the memory device enters a non-select state.

(3) when the chip select signal is supplied to the chip select terminal so that the chip select terminal is set to the second level ("L" level, for example), the test circuit is activated to carry out the test on the terminals of the first group.

(4) When the chip select terminal is set to the first level ("H" level, for example), the test circuit is deactivated.

(5) When the chip select terminal is set to the second level ("L" level, for example) again, the test circuit is activated and the terminals of the second group are tested.

(6) When the chip select terminal is set to the first level ("H" level, for example), the test circuit is deactivated.

(7) When the chip select signal is set to the second level ("L" level, for example) again, the test circuit is activated and the test is carried out on the terminals of the third group.

(8) When the chip select terminal is set to the first level ("H" level, for example), the test circuit is deactivated into a normal operation mode and hereinafter, the test mode is not assumed.

In this case, the memory device has mounted thereon such a test circuit that the normal operation mode is assumed when it is detected, four times, that the test mode is assumed by the application of a power supply voltage and the chip select terminal is set to the first level.

In the case in which a contact check is desired for the terminals of a personal computer or the like, a test for checking the state of the contact of a plurality of groups of terminals is carried out in accordance with the sequence described above.

In normal operations, on the other hand, once a signal of predetermined level is input to the chip select terminal a predetermined number of times and the normal operation mode is assumed after activating the personal computer or the like, the test mode is not erroneously assumed subsequently.

As described above, according to the present invention, the test circuit is activated with a simple activation sequence within a normally applied voltage range by using the existing terminals such as the chip select terminal, and at the same time the test circuit is not easily activated in the condition of normal operations. Therefore, the test such as the contact check of the terminals can be carried out by a method simpler than in the prior art without affecting the condition of normal operations.

BRIEF DESCRIPTION OF THE DRAWINGS

The above object and features of the present invention will be more apparent from the following description of the preferred embodiments with reference to the accompanying drawings, wherein:

FIG. 4 is a diagram showing an example of an input terminal test table;

FIG. 5 is a diagram showing an example of an I/O terminal test table;

DESCRIPTION OF THE PREFERRED EMBODIMENTS

Preferred embodiments of the invention will be explained below with reference to the accompanying drawings (FIGS. 1 to 11).

Figure 1:
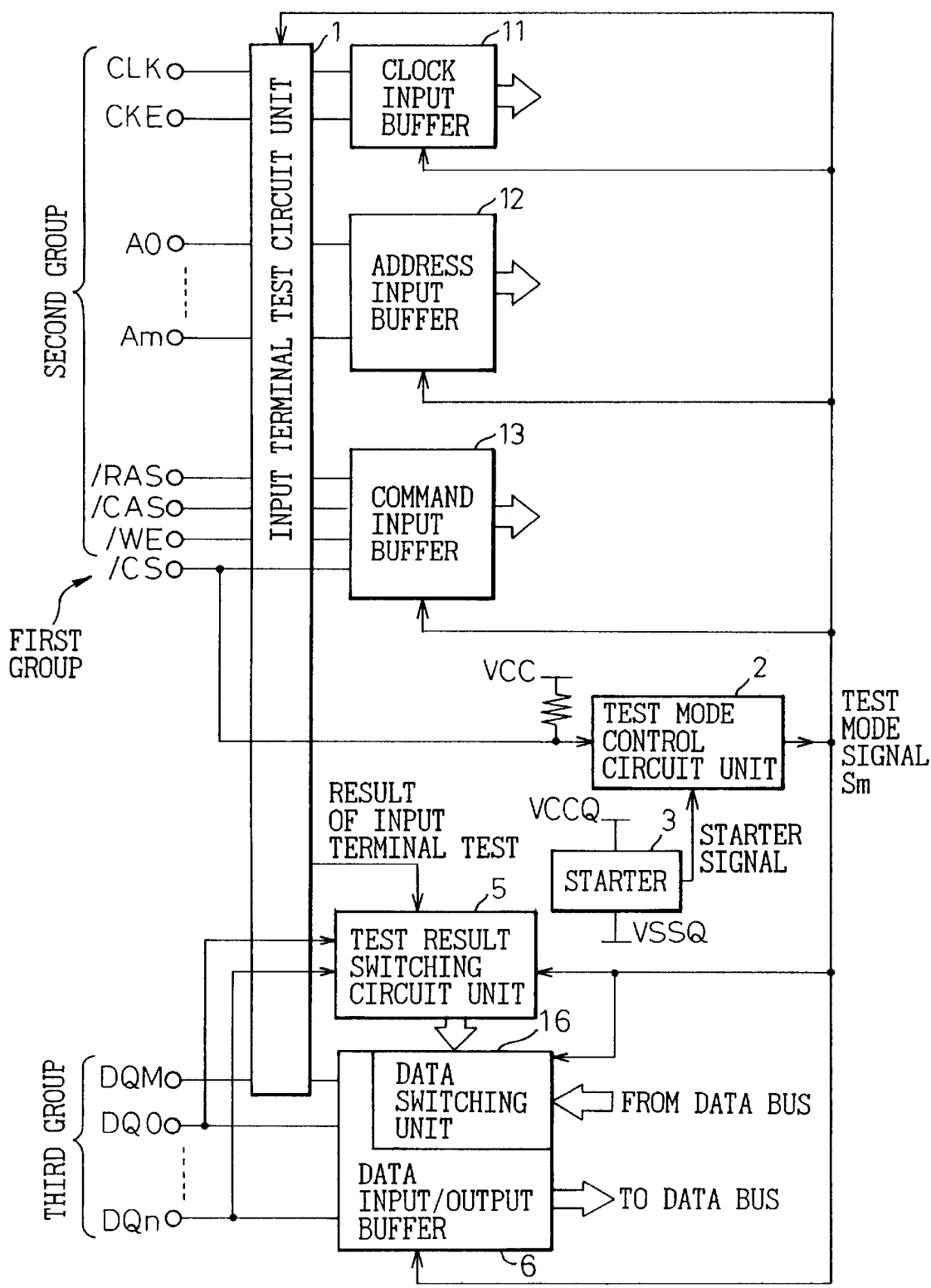
FIG. 1 is a block diagram showing a configuration of an embodiment of the present invention.

FIG. 1 is a block diagram showing a configuration of an embodiment of the present invention. In the case under consideration, this block represents the essential parts of a test circuit for carrying out a test by a contact check of the terminals of a memory device.

The embodiment of the test circuit shown in FIG. 1 is configured so that a plurality of terminals of the memory device are divided into three groups of terminals for the purpose of test.

A first group includes terminals essential for operating the test circuit and includes a chip select terminal for inputting a chip select signal /CS ("/" before the symbol CS indicates a signal in active low which becomes a low level in an active state) and a power supply terminal for supplying a power supply voltage to various circuits in the memory device. This power supply terminal is used to supply a power supply voltage VCCQ at the high voltage side and a power supply voltage VSSQ at the low voltage side dedicated to the data output circuit unit (described later with reference to FIGS. 9 and 11), a power supply voltage VCC at the high voltage side and a power supply voltage VSS at the low voltage side for the other internal circuits.

A second group represents input terminals including terminals for inputting a clock CLK and a clock enable signal CKE, terminals for inputting various command signals (a load address strobe signal /RAS, a column address strobe signal /CAS and a write enable signal /WE for selecting the operation mode of the memory device), DQM terminals for inputting a data mask signal DQM to mask a part of data for preventing the data from being rewritten, and address input terminals for inputting addresses A0 to Am (m: arbitrary positive integer), where "/" before each of the symbols RAS, CAS and WE indicates a signal in active low.

A third group represents data input/output terminals (sometimes abbreviated as I/O terminals) including terminals for inputting data DQ0 to DQn (n: arbitrary positive integer).

The embodiment shown in FIG. 1 includes an input terminal test circuit unit 1 for carrying out a test for checking the state of the contact of the terminals of the first and second groups. The test mode control circuit unit 2 has the function of controlling the sequence of the test for checking the state of the contact of the terminals divided into the three groups of terminals as described above.

In FIG. 1, the clock CLK and the clock enable signal CKE are supplied to the input terminal test circuit unit 1, and also supplied to the memory device through the clock input buffer 11. The low address strobe signal /RAS, the column address strobe signal /CAS and the write enable signal /WE are supplied to the input terminal test circuit unit 1, and also supplied to the memory device through the command input buffer 13. The addresses A0 to Am are supplied to the input terminal test circuit unit 1 and also supplied to the memory device through the address input buffer 12.

Further, the embodiment shown in FIG. 1 comprises a starter 3 for generating a starter signal by detecting that a power supply voltage is applied through a power supply terminal; and a test mode control circuit unit 2 for determining which type of test mode the memory device is to be set to, on the basis of the starter signal and the chip select signal /CS, or otherwise, determining that the memory device is to be set to a normal operation mode, and further, for a given test mode, determining which group of terminals are to be tested. A power supply of the starter 3 is desirably connected to the power supply terminal for supplying the power supply voltages VCCQ, VSSQ dedicated to the data output circuit unit (described later with reference to FIGS. 9 and 11). The reason is that, as described later, the test result is output in this embodiment from the data output circuit unit supplied with the source voltages VCCQ, VSSQ, and therefore, it is essential to supply the power supply voltages VCCQ, VSSQ to the data output circuit unit without fail at the time of the terminal connection test.

Upon application of the power supply voltage to the starter 3 through the power supply terminal, the starter 3 generates a starter signal. Once this starter signal is input thereto, the test mode control circuit unit 2 is activated. Then, the chip select signal /CS becomes "L" level, so that the test mode control circuit unit 2 outputs a test mode signal Sm. This test mode signal Sm which is output from the test mode control circuit unit 2 sets the memory device in the test mode. Further, the test mode control circuit unit 2 controls the circuit for the terminal connection test in accordance with the chip select signal /CS, and upon detection of the "H" level chip select signal /CS of an "H" level a predetermined number of times, the test is finished and the memory device is set to the normal operation mode.

A resistor inserted between the chip select terminal for inputting the chip select signal /CS and the power supply line for supplying the power supply voltage VCC at the high voltage side has the function of ensuring the supply of the "H" level chip select signal /CS to the test mode control circuit unit 2 even when the chip select terminal is defectively connected (/CS="H"), and also the function of holding the data input/output terminals DQ0 to DQn (which may be referred to as DQ representing one of the data input/output terminals) in high impedance (DQ="High-Z") so as not to affect the tests of other memory devices.

Further, the embodiment shown in FIG. 1 includes a test data switching circuit unit 5 for inputting data (DQ0 to DQn). This test data switching circuit unit 5 has the function of switching the test result concerning the terminals of the first to third groups by means of the test mode signal Sm and transmitting the test result to the data input/output buffer 6.

The data input/output buffer 6 has the function of exchanging the data (DQ0 to DQn) with the data bus and includes a data switching unit 16. As long as the memory device is in the terminal connection test mode, the signal indicating the terminal test result is output asynchronously with the clock CLK. In the case in which the memory device is in an normal operation mode, in contrast, the signal from the data bus is output in synchronism with the clock CLK.

Figure 2:
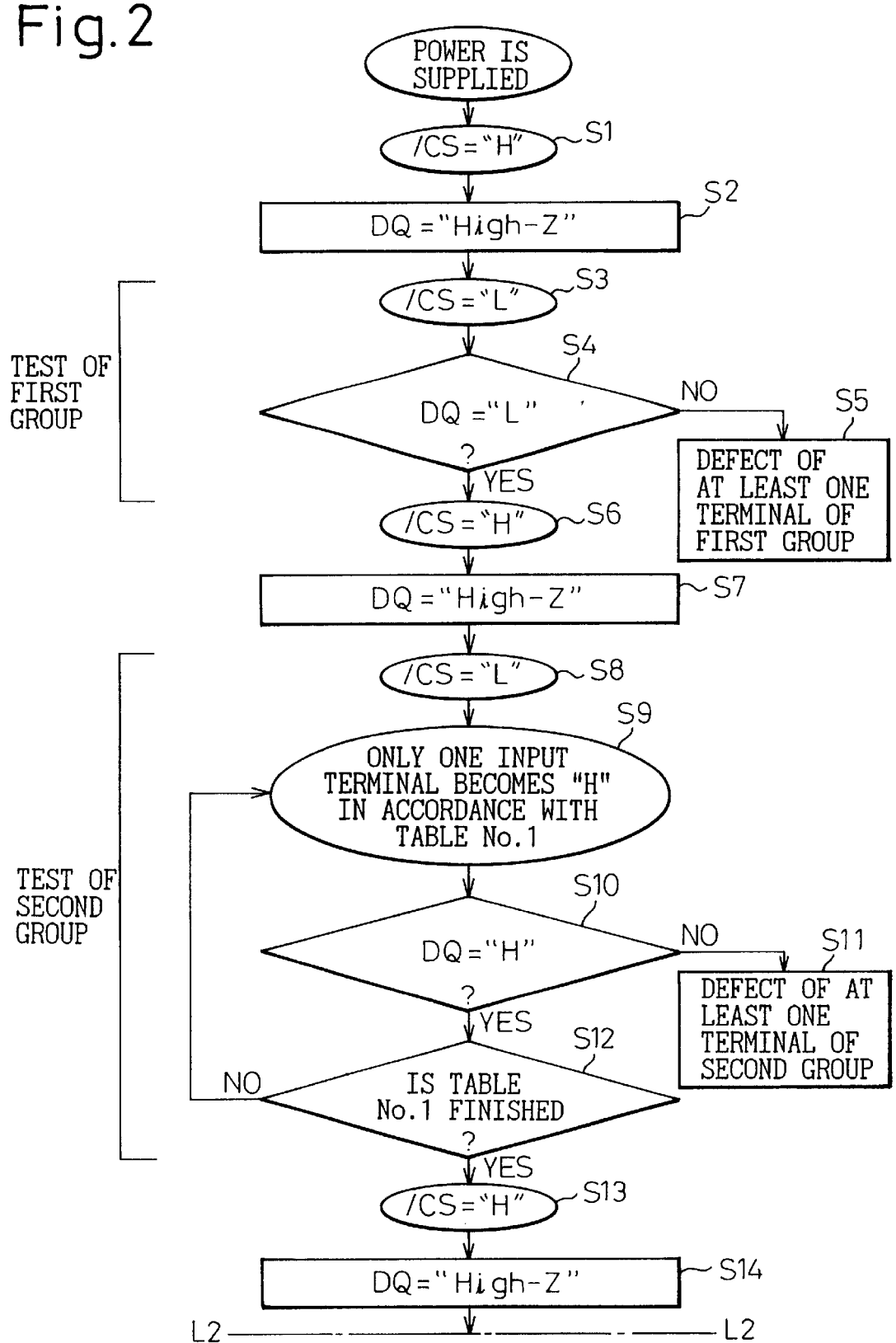
FIG. 2 is a flowchart No. 1 for explaining a method of testing a semiconductor device according to the present invention.
Figure 3:
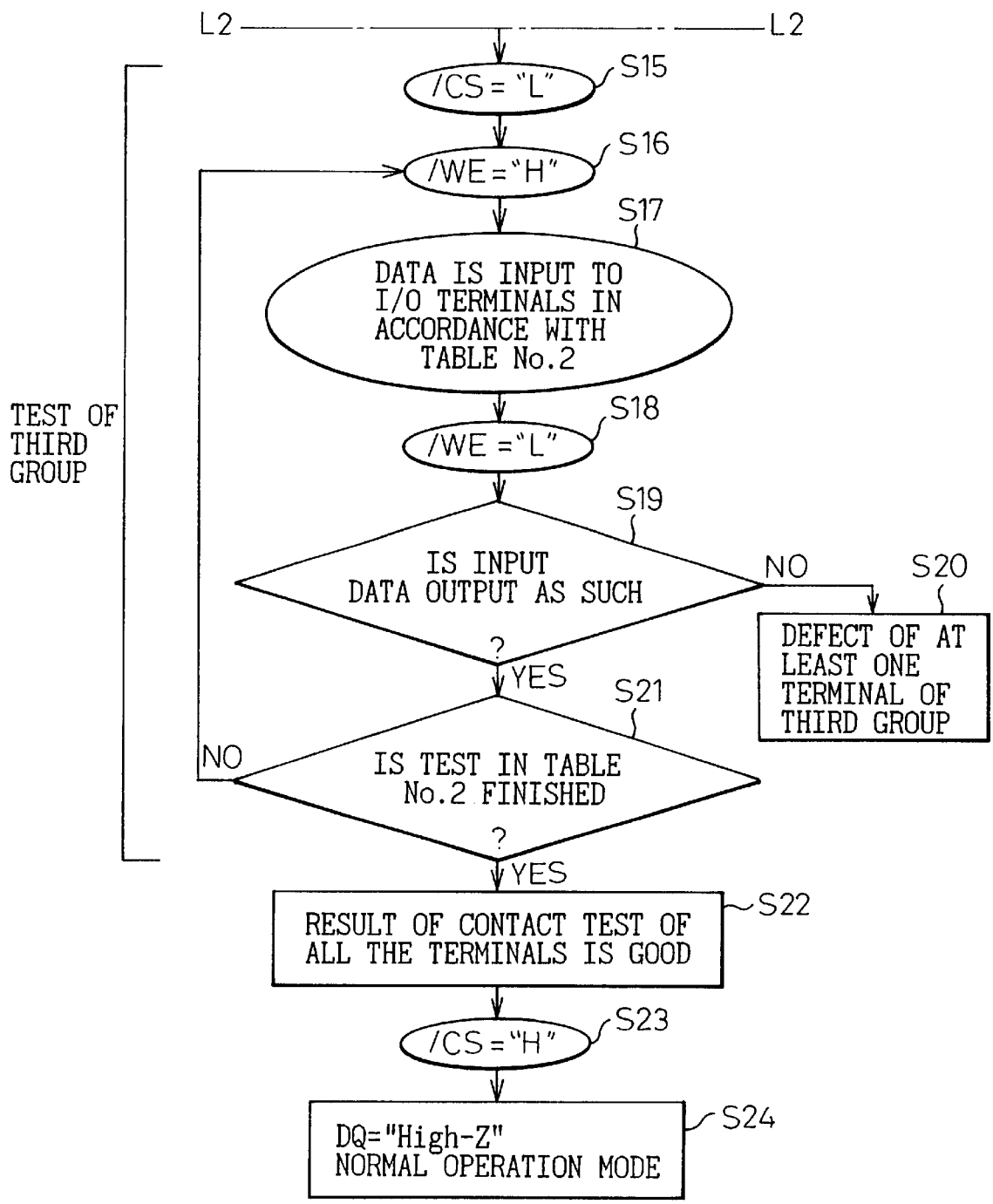
FIG. 3 is a flowchart No. 2 for explaining a method of testing a semiconductor device according to the present invention.

FIGS. 2 and 3 are flowcharts No. 1 and No. 2 for explaining a method of testing the semiconductor device according to the present invention, respectively. FIG. 4 is a diagram showing an example of an input terminal test table, and FIG. 5 is a diagram showing an example of an I/O terminal (data input/output terminal) test table. In this case, as described with reference to the embodiment of FIG. 1, an explanation will be given concerning a method of carrying out a test for checking the state of the contact of the terminals of the three groups. In the description that follows, the component elements similar to those described above will be designated by the same reference numerals, respectively.

In the flowchart of FIG. 2, upon application of a power supply voltage thereto, the starter generates a starter signal and the memory device assumes the test mode. In the process, as shown in step S1, the "H" level chip select signal /CS is input to the chip select terminal so that the memory device enters a non-select state. As a result, as shown in step S2, the data input/output terminals DQ0 to DQn are held in high impedance (DQ="High-Z").

Then, as shown in step S3, a "L" level chip select signal /CS is input to the chip select terminal (/CS is input for the first time; /CS="L"). This "L" level chip select signal /CS activates the circuit for the terminal connection test thereby to carry out the test on the terminals of the first group. In the case in which all the terminals of the first group have a satisfactory contact (step S4), all the data output from a specific data input/output terminal DQ become "L" level (DQ="L").

The test on the terminals of the first group is successful if DQ="L" when the first "L" level chip select signal /CS is input. In other words, the test on the terminals of the first group is considered successful in the case in which the following test result is obtained.

(1) Generation of a starter signal means that the state of the connection of the power supply terminal is satisfactory for supplying the power supply voltages VCCQ, VSSQ.

(2) The fact that the circuit for carrying out the terminal connection test is activated means a non-defective connection of the power terminal for supplying the source voltages VCC, VSS. Further, (3) The fact that all the data (DQ) are at "L" level is indicative of a satisfactory connection of the chip select terminal for inputting the chip select signal /Cs.

On the other hand, in the case in which the data (DQ) output as a result of the test described above (step S4) is ascertained to be at "H" level, it is determined that at least one of the terminals of the first group is defective (step S5).

Then, as shown in step S6, when the "H" level chip select signal /CS is input to the chip select terminal (/CS="H"), as shown in step S7, the data input/output terminals DQ0 to DQn are set in high impedance (DQ="High-Z").

Further, as shown in step S8, the "L" level chip select signal /CS is input again to the chip select terminal (/CS is input for the second time; /CS="L"). This "L" level chip select signal /CS is used to start the test on the terminals of the second group. The test on the terminals of the second group is carried out in accordance with the input terminal test table No. 1 shown in FIG. 4 in the second case in which the chip select signal /CS becomes "L" level (/CS="L").

The input terminal test table of FIG. 4 is used for testing whether or not the data input/output terminal DQ (one of the terminals DQ0 to DQ7, although the arrangement can be made to output the same test result at the same time from a plurality of data input/output terminals DQ) outputting the test result is at "H" level ("1" level) or not when a "H" level ("1" level) signal is applied to any one of a plurality of input terminals for inputting the addresses A0 to A6, the data mask signal. DQM, the write enable signal /WE, the column address strobe signal /CAS, the row address strobe signal /RAS, the clock enable signal CKE and the clock CLK (step S9 in FIG. 2).

Further, in step S10 of the flowchart of FIG. 2, in the case in which the data DQ is at "H" level when a "H" level signal ("1" level signal) is input to any one of a plurality of the input terminals, it is determined that the contact of the particular input terminal is satisfactory. Further, the input terminal supplied with a "H" level signal ("1" level signal) is sequentially changed in accordance with the input terminal test table thereby to test whether or not the contact of all the input terminals is satisfactory. In the case in which the test of every input terminal shows that the data DQ is at "H" level, the test on the terminals of the second group is successful (step S12).

On the other hand, assuming that the input terminal test circuit unit detects that each of zero or two or more than two input terminals is at "H" level, a "L" level ("0" level) data is output and therefore it is determined that the contact of the input terminal is defective (step S11).

Then, as shown in step S13, the chip select terminal is supplied with the "H" level chip select signal /CS (/CS="H"), and as shown in step S14, the data input/output terminals DQ0 to DQn are set in high impedance (DQ="High-Z").

Further, in the flowchart of FIG. 3, as shown in step S15, the "L" level chip select signal /CS is input again to the chip select terminal (/CS is input for the third time; /CS="L"). In response to this "L" level chip select signal /CS, the test is carried out on the terminals of the third group in steps S16 to S21. The test on the terminals of the third group is carried out according to the I/O terminal test table. No. 2 of FIG. 5 in the third case in which the chip select signal /CS becomes "L" level (/CS="L").

The I/O terminal test table of FIG. 5 is arranged so that a specific one of the eight I/O terminals to which the 8-bit data (DQ0 to DQ7) are applied is supplied with a "H" level data ("1" data) while supplying a "L" level ("0" level) data to the other I/O terminals. In this case, by changing the specific I/O terminal, five combinations of "H" level ("1" level) and "L" level ("0" level) are produced for the input data (DQ0 to DQ7). These combinations makes it possible to carry out not only a contact test of each I/O terminal but a short-circuit test between adjoining I/O terminals, or the like, as well. In the case in which the I/O terminals are not defective, the signal (data) applied to the I/O terminals is output as such from the I/O terminals.

The process of steps S16 to S21 will be specifically described. In step S16 of the flowchart shown in FIG. 3, the input and the output of the data (DQ0 to DQ7) are switched by the use of the terminal for inputting the write enable signal /WE. Specifically, by turning the write enable signal /WE to "H" level for data input, the data DQ0 to DQ7 are input simultaneously to each I/O terminal in accordance with the I/O terminal test table (step S17). Then changing the write enable signal /WE to a "L" level and switching it to the data output mode (step S18), the input data (DQ0 to DQ7) are output again from each I/O terminal.

In the case in which the input data DQ0 to DQ7 are output as such in step S19 of FIG. 3, it is determined that the contact of the I/O terminals is not defective. Further, by changing the combination of "1" and "0" of the data (DQ0 to DQ7) in accordance with the I/O terminal test table, all the combinations are tested as to whether or not the contact of the I/O terminal is satisfactory (step S21). In the case in which it is confirmed that the data (DQ0 to DQ7) are output as such for every combination, the test of the terminals of the third group is also successful. At the same time, it is determined that the test result on the contact of all the terminals is satisfactory, i.e. the memory device tested is a satisfactory product (step S22).

Then, when the "H" level chip select signal /CS is input to the chip select terminal as shown in step S23 (/CS="H"), the data input/output terminals DQ0 to DQn become high impedance as shown in step S24 (DQ="High-Z"). In this process, the memory device turns to the normal operation mode and the test mode is not subsequently assumed. Specifically, according to the test method shown in the flowcharts of FIGS. 2 and 3, the normal operation mode is restored after detecting that the chip select terminal has turned to an "H" level four times.

The flow of the process for carrying out the test on the terminal connection of a memory device was described above. In determining the terminal connection of the other memory devices sharing the data bus with the particular memory device, the chip select signal /CS of an active level is repeatedly applied to the other memory devices and a test similar to the process flow of FIGS. 2 and 3 is carried out.

Figure 6:
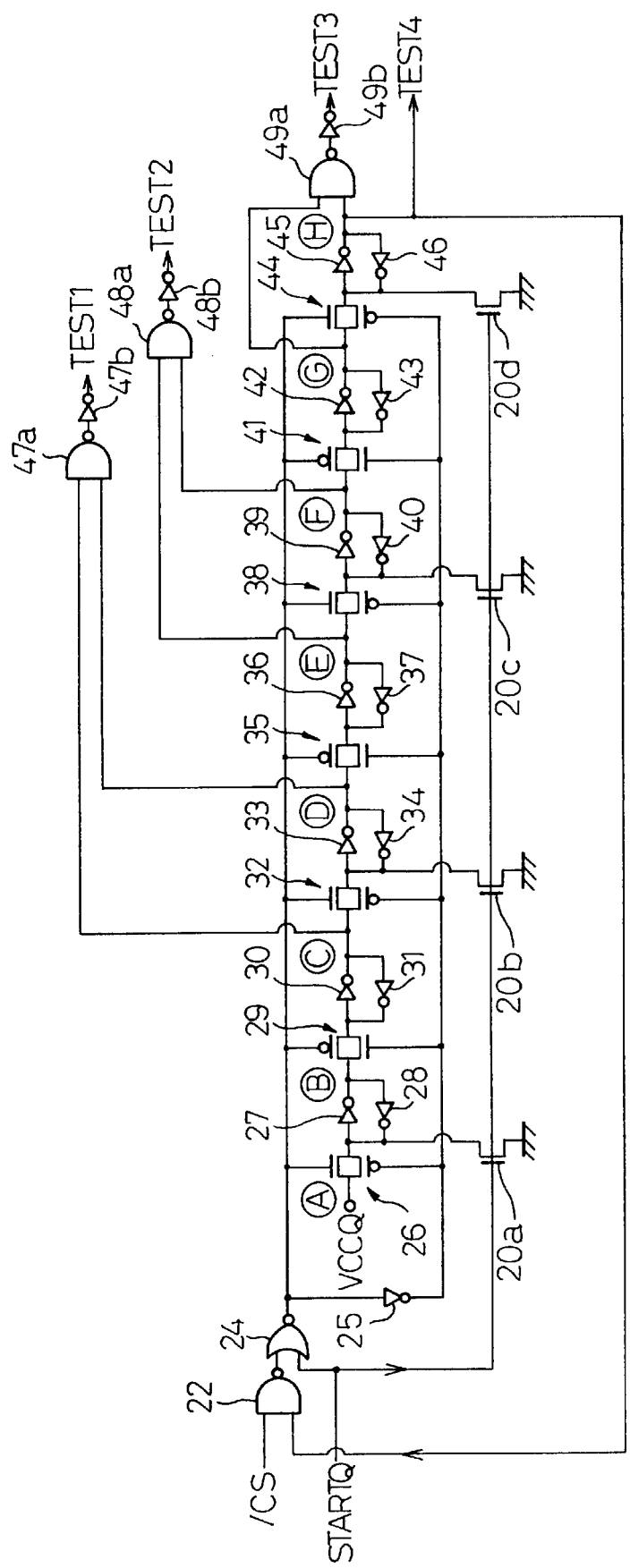
FIG. 6 is a circuit diagram showing a specific example of the configuration of the test mode control circuit unit shown in FIG. 1.
Figure 7:
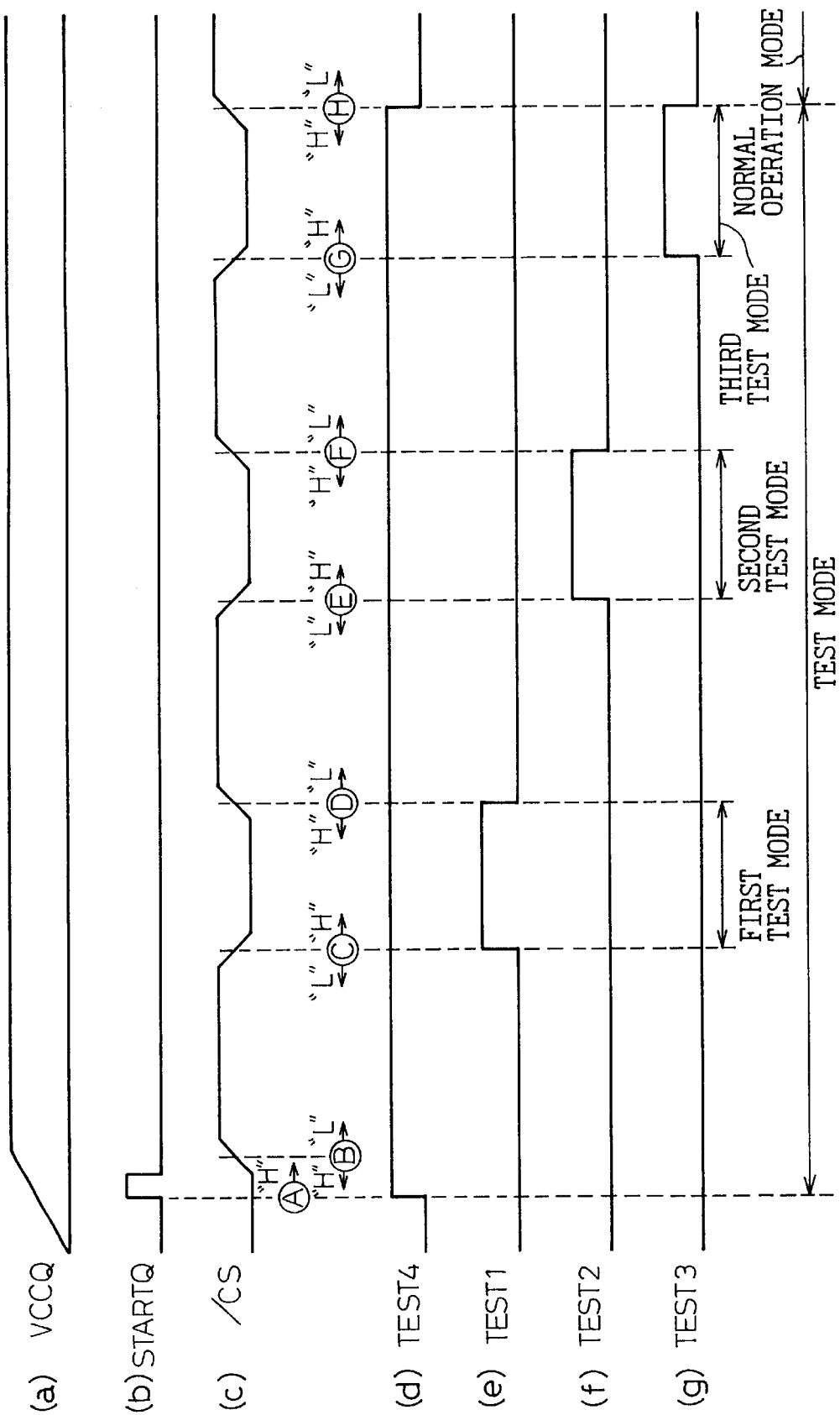
FIG. 7 is a timing chart for explaining the operation of the test mode control circuit unit of FIG. 6.

FIG. 6 is a circuit diagram showing a specific example of the configuration of the test mode control circuit unit of FIG. 1. FIG. 7 is a timing chart for explaining the operation of the test mode control circuit unit of FIG. 1.

The test mode control circuit unit 2 shown in FIG. 6 is configured with a cascade connection of a plurality of stages (7 stages in FIG. 6) of circuit elements each including a transfer switch (a transfer switch 26, for example) having a p-channel MOS transistor (hereinafter referred to as the pMOS transistor) and a n-channel MOS transistor (hereinafter referred to as the nMOS transistor) and a pair of inverters (inverters 27, 28, for example) making up a latch circuit.

More specifically, the circuit element in the first stage includes the transfer switch 26 operated in response to the chip select signal /CS and a latch circuit unit having a pair of the inverters 27, 28. The pMOS transistor and the nMOS transistor making up the transfer switch 26 are connected in parallel to each other. The gate of the PMOS transistor is connected to an output terminal of a NOR gate 24 through an inverter 25, while the gate of the nMOS transistor is supplied with the output terminal of the NOR gate 24 as such. Further, the source of the pMOS transistor and the drain of the nMOS transistor are connected to a power terminal (node A) for supplying the power supply voltage VCCQ dedicated to the data output circuit unit (described later with reference to FIGS. 9 and 11). On the other hand, the drain of the pMOS transistor and the source of the nMOS transistor are connected to the input terminal of the latch circuit unit in the circuit element in the first stage.

The input terminal of the latch circuit unit in the first stage is connected to the drain of the nMOS transistor 20a. The gate of the nMOS transistor 20a is supplied with a starter signal (STARTQ) from a starter 3. The nMOS transistor 20a carries out on/off operations in accordance with the starter signal from the starter thereby to control the state of the latch circuit unit in the first stage. Specifically, in response to the starter signal of the "H" level pulse, the nMOS transistor 20a is turned on, so that the input terminal of the latch circuit unit is reset to "L" level.

Further, the circuit element in the second stage, like the circuit element in the first stage, includes a transfer switch 29 operated in response to the chip select signal /CS and a latch circuit unit having a pair of inverters 30, 31. The output terminal (node B) of the latch circuit unit in the first stage is connected to the source of the pMOS transistor and the drain of the nMOS transistor of the transfer switch 29 in the second stage.

Furthermore, the circuit element in the third stage, like the circuit element in the preceding stage, includes a transfer switch 32 operated in response to the chip select signal /CS and a latch circuit unit having a pair of inverters 33, 34. The output terminal (node C) of the latch circuit in the second stage is connected to the source of the pMOS transistor and the drain of the nMOS transistor of the transfer switch 32 in the third stage. The input terminal of the latch circuit unit in the third stage is connected to the drain of the nMOS transistor 20b. The gate of the nMOS transistor 20b is supplied with the starter signal (STARTQ) from the starter 3. The nMOS transistor 20b turns on/of in response to the starter signal from the starter thereby to control the state of the latch circuit unit in the third stage.

In addition, the circuit element in the fourth stage, as in the circuit element in the preceding stage, includes a transfer switch 35 operated in response to the chip select signal /CS and a latch circuit unit having a pair of inverters 36, 37. The output terminal (node D) of the latch circuit in the third stage is connected to the source of the pMOS transistor and the drain of the nMOS transistor of the transfer switch 35 in the fourth stage.

What is more, the circuit element in the fifth stage, as in the circuit element in the preceding stage, includes a transfer switch 38 operated in response to the chip select signal /CS and a latch circuit unit having a pair of inverters 39, 40. The output terminal (node E) of the latch circuit in the fourth stage is connected to the source of the pMOS transistor and the drain of the nMOS transistor of the transfer switch 38 in the fifth stage. The input terminal of the latch circuit unit in the fifth stage is connected to the drain of the nMOS transistor 20c. The gate of the nMOS transistor 20c is supplied with the starter signal (STARTQ) from the starter 3. The nMOS transistor 20c turns on/off in accordance with the starter signal from the starter thereby to control the state of the latch circuit unit in the fifth stage.

Further, the circuit element in the sixth stage, as in the circuit element in the preceding stage, includes a transfer switch 41 operated in response to the chip select signal /CS and a latch circuit unit having a pair of inverters 42, 43. The output terminal (node F) of the latch circuit in the fifth stage is connected to the source of the PMOS transistor and the drain of the nMOS transistor of the transfer switch 41 in the sixth stage.

Furthermore, the circuit element in the seventh (last) stage, as in the circuit element in the preceding stage, includes a transfer switch 44 operated in response to the chip select signal /CS and a latch circuit unit having a pair of inverters 45, 46. The output terminal (node G) of the latch circuit in the sixth stage is connected to the source of the pMOS transistor and the drain of the nMOS transistor of the transfer switch 44 in the seventh stage. The output terminal (node H) of the latch circuit unit in the seventh stage is connected to the input terminal of the NAND gate 49a.

Further, the test mode control circuit unit 2 shown in FIG. 6 includes, at the input side of the circuit element in the first stage, a NOR gate 24 and a NAND gate 22 for adequately processing and supplying the chip select signal /CS and the starter signal (STARTQ) to the circuit element in the seventh stage.

In addition, the test mode control circuit unit 2 shown in FIG. 6 includes a NAND gate 47a for receiving the signal from the node C and the signal from the node D, an inverter 47b connected to the output terminal of the NAND gate 47a, a NAND gate 48a for receiving the signal from the node E and the signal from the node F, an inverter 48b connected to the output terminal of the NAND gate 48a, a NAND gate 49a for receiving the signal from the node G and the signal from the node H, and an inverter 49b connected to the output terminal of the NAND gate 49a. In carrying out a switching operation between test mode and normal operation mode, a test mode switching signal TEST4 is output from the node H. In the case in which the test mode prevails, on the other hand, a first test mode signal TEST1 for testing the terminals of the first group is output from the inverter 47b, a second test mode signal TEST2 for testing the terminals of the second group is output from the inverter 48b, and a third test mode signal TEST3 for testing the terminals of the third group is output from the inverter 49b.

Now, the operation of each part of the test mode control circuit unit of FIG. 6 will be explained with reference to the timing chart of FIG. 7.

When carrying out the test on the terminals of a memory device, the first step is to apply the power supply voltage to the power supply terminal for supplying the power supply voltage VCCQ dedicated to the data output circuit unit (portion (a) of FIG. 7). Then, the starter detects that the power supply voltage is applied to the power supply terminal, thereby generating a starter signal (STARTQ) of "H" level (portion (b) of FIG. 7). This "H" level starter signal is applied to the gates of the nMOS transistors 20a to 20d, so that the output terminal of the corresponding latch circuit unit turns to "H" level. Thus, the node H of the output terminal of the latch circuit in the seventh stage also becomes "H" level, and the test mode switching signal TEST4 at "H" level is output from the node H. Thus, the normal operation mode is switched to the test mode (portion (d) of FIG. 7). In the process, the output of the NOR gate 24 is at "L" level due to the starter signal of "H" level, and therefore the transfer switches 26, 32, 38, 44 turn off and the transfer switches 29, 35, 41 turn on. Thus, the level of the nodes C, D, E, F, G, H become "L", "H", "L", "H", "L" and "H" levels, respectively, with all the test mode signals TEST1, TEST2, TEST4 at "L" level.

Then, the "H" level chip select signal /CS is supplied to the NAND gate 22 from the chip select terminal (portion (c) of FIG. 7). As a result, the output level of the NOR gate 22 turns to "L" level. Since the starter signal becomes "L" level, on the other hand, the output level of the NOR gate 24 becomes "H" level so that the state of the transfer switch is inverted. Specifically, the transfer switches 29, 35, 41 turn off and the transfer switches 36, 32, 44 turn on. Further, the "L" level starter signal is input to the gates of the nMOS transistors 20a to 20d of the nMOS transistor, and therefore the output terminal of the corresponding latch circuit unit becomes "L" level (the node B turns from "H" level to "L" level, for example), thereby finishing the reset operation in the test mode control circuit unit. On the other hand, the node A is supplied with the "H" level power supply voltage VCCQ, and therefore the output terminal (node B) of the latch circuit in the first stage turns from "H" level to "L" level.

Upon application of the first "L" level chip select signal /CS to the NAND gate 22, the output level of the NOR gate 24 becomes "L" level, and the transfer switch 29 is turned on As a result, the "L" level signal of the node B at the output terminal of the latch circuit unit in the first stage is input to the latch circuit unit in the second stage through the transfer switch 29, so that the output terminal (node C) of the latch circuit unit in the second stage turns from "L" level to "H" level. On the other hand, the level of the nodes D, E, F, G remains unchanged. Thus, the level of the nodes C and D are "H" levels, and therefore the two input terminals of the NAND gate 47a are both supplied with a "H" level signal. As a result, the output of the NAND gate 47a becomes "L" level, and the first test mode signal TEST1 of "H" a level is output through the inverter 47b. At the same time, the first test mode is assumed for testing the terminals of the first group. The first test mode is held by the corresponding latch circuit unit until the "H" level chip select signal /CS is supplied (portion (e) of FIG. 7).

After that, upon application of the "H" level chip select signal /CS to the NAND gate 22, the output of the NOR gate 24 becomes "H" level and the transfer switch 32 is turned on. As a result, the "H" level of the node C at the output terminal of the latch circuit unit in the second stage turns the node D from "H" level to "L" level. Thus, one of the input terminals of the NAND gate 47a is supplied with the "H" level, and the other input terminal thereof supplied with the "L" level signal. Consequently, the output of the NAND gate 47a becomes "H" level, and the first test mode signal TEST1 of "L" level is output through the inverter 47b. At the same time, the test circuit is deactivated thereby to finish the first test mode.

After that, with the starter signal at "L" level, assume that the second "L" level chip select signal /CS is supplied to the NAND gate 22. The output of the NOR gate 24 becomes "L" level, and the transfer switch 35 is turned on. Thus, both the nodes E and F at the output terminal of the latch circuit units in the fourth and fifth stages become "H" level. As a result, the output level of the NAND gate 48a turns to "L" level, and the second test mode signal TEST2 of "H" level is output through the inverter 48b. Thus, the second test mode is assumed for testing the terminals of the second group. This second test mode is held by the corresponding latch circuit unit until the "H" level chip select signal /CS is supplied (portion (f) of FIG. 7).

Subsequently, when the "H" level chip select signal /CS is supplied again to the NAND gate 22, the output of the NOR gate 24 becomes "H" level again, so that the transfer switch 38 is turned on. Thus, the node F at the output terminal of the latch circuit unit in the fifth stage turns from "H" level to "L" level, the output of the NAND gate 48a turns to "H" level, and the "L" level second test mode signal TEST2 is output through the inverter 48b. At the same time, the test circuit is deactivated thereby to finish the second test mode.

After that, with the starter signal at "L" level, if it is assumed that the third "L" level chip select signal /CS is supplied to the NAND gate 22, the output level of the NOR gate 24 turns to "L" level, and the transfer switch 41 is turned on. As a result, both the nodes G and H at the output terminal of the latch circuit units in the sixth and seventh stages turn to "H" level, so that both of the two input terminals of the NAND gate 49a are supplied with an "H" level signal. As a result, the output level of the NAND gate 49a turns to "L" level, and the third test mode signal TEST3 of "H" level is output through the inverter 49b. At the same time, the third test mode is started for testing the terminals of the third group. This third test mode is held by the corresponding latch circuit unit until the "H" level chip select signal /CS is supplied (portion (g) of FIG. 7).

After that, when the "H" level chip select signal /CS is supplied again to the NAND gate 22, the output level of the NOR gate 24 turns to "H" level again, so that the transfer switch 44 is turned on. Thus, the node H at the output terminal of the latch circuit units in the sixth and seventh stages turns from "H" level to "L" level, so that the two input terminals of the NAND gate 49a are supplied with "H" level and "L" level signals, respectively. As a result, the output level of the NAND gate 49a turns to "H" level, and the "L" level third test mode signal TEST3 is output through the inverter 49b. At the same time, the test circuit is deactivated and the third test mode is finished.

At the same time, the node H at the output terminal of the latch circuit in the seventh stage changes from "H" level to "L" level, with the result that the test mode switching signal TEST4 output from this node H also turns to "L" level. Thus, the test mode is finished and the normal operation mode is entered. Under this condition, one of the input terminals of the NAND gate 22 remains at "L" level, and therefore the subsequent chip select signal /CS cannot be accepted. Specifically, upon application of the "L" level chip select signal /CS a predetermined number of times (four times in this case), the test mode switches to the normal operation mode automatically, and the test mode is prevented from being erroneously assumed subsequently.

Figure 8:
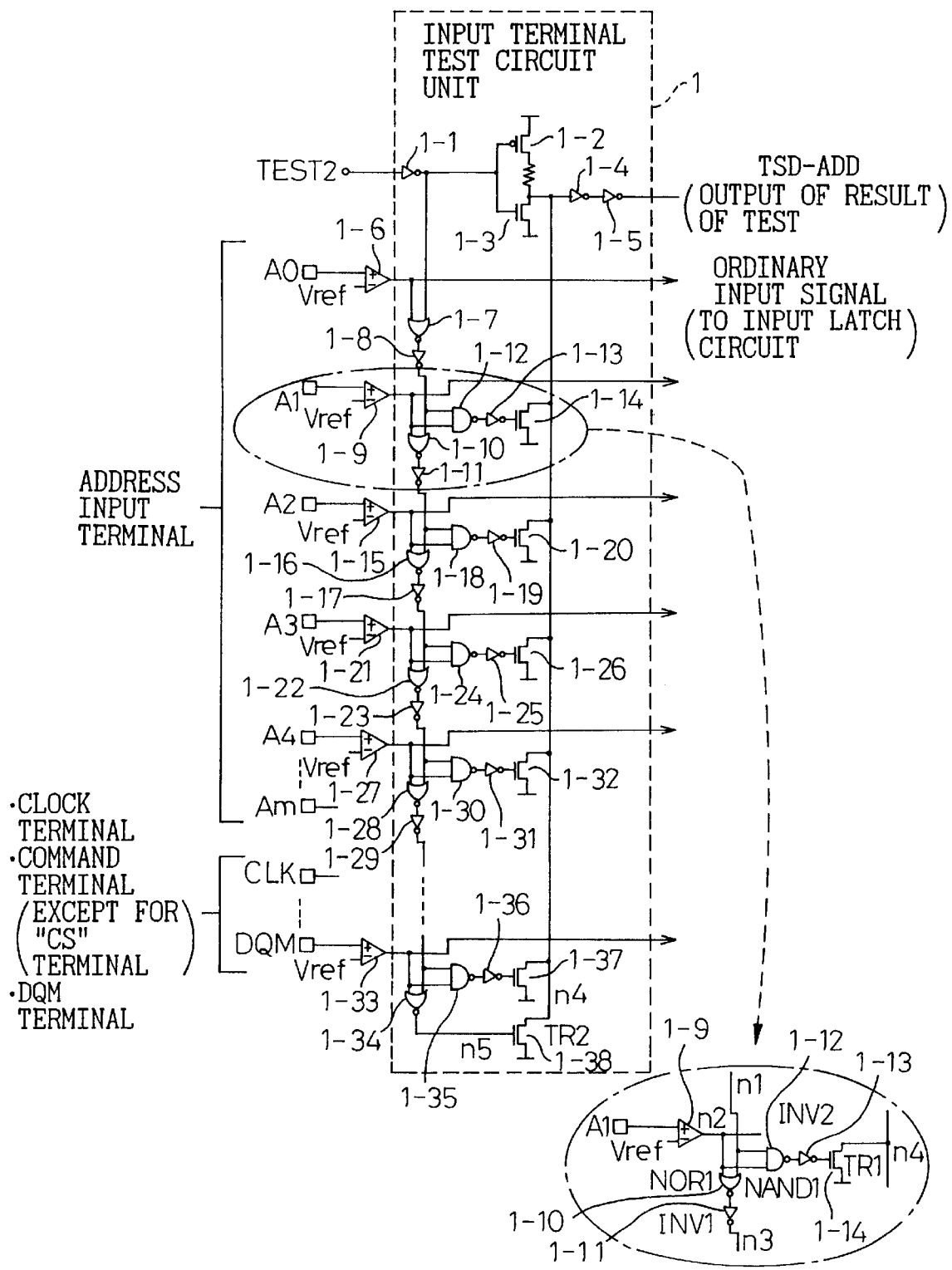
FIG. 8 is a circuit diagram showing a specific example of the configuration of the input terminal test circuit unit of FIG. 1.

FIG. 8 is a circuit diagram showing a specific example of the configuration of the input terminal test circuit unit of FIG. 1. The input terminal test circuit unit 1 carries out the test for confirming the state of the contact of the terminals of the second group as described above.

The input terminal test circuit unit shown in FIG. 8 includes an inverter 1-1 supplied with the second test mode signal TEST2 for confirming the state of the contact of the terminals (i.e., the input terminals) of the second group, a pMOS transistor 1-2 and a nMOS transistor 1-3 connected in series through a resistor and two inverters 1-4, 1-5 for receiving the signal from the drain of the nMOS transistor 1-3. The pMOS transistor 1-2 and the nMOS transistor 1-3 make up an inverter circuit and have the function of producing an inverted output of the signal from the inverter 1-1.

Further, the input terminal test circuit unit shown in FIG. 8 includes a plurality of NOR gates 1-7, 1-10, 1-16, 1-22, 1-28 and so on for determining the state of the contact of the terminals receiving the addresses A0 to Am (in this case, the addresses A0 to A4 processed by a NOR gate are shown as a typical case), the clock CLK and various command signals (other than /CS), and a plurality of inverters 1-8, 1-11, 1-17, 1-23, 1-29 and so on connected to the NOR gates, respectively (the output of the NOR gate 1-34 in the last stage has no inverter). The addresses A0, A1, . . . , Am, the clock CLK and the data mask signal DQM are transmitted also to the input latch circuit.

Further, the input terminal test circuit unit described above includes a plurality of NAND gates 1-12, 1-18, 1-24, 1-30, . . . , 1-35 for determining the contact condition of the terminals for receiving the addresses A1 to Am (the addresses A1 to A4 processed by the NOR gate are shown here as a typical case), the clock CLK and various command signals (other than the chip select signal /CS), a plurality of inverters 1-13, 1-19, 1-25, 1-31, . . . , 1-36 connected to the NAND gates, respectively, and a plurality of nMOS transistors 1-14, 1-20, 1-26, 1-32, . . . , 1-37 connected to the inverters, respectively. The drains of the nMOS transistors 1-14, 1-20, 1-26, 132, . . . , 1-37 are connected to a common drain of the nMOS transistor 1-3 described later.

The addresses A0 to A4 from the address input terminal, the signals from the clock terminal, the various signals from command terminals and the signal from the DQM terminal are desirably input to the corresponding NOR gates and the NAND gates, respectively, after being amplified in the comparators 1-6, 1-9, 1-15, 1-21, 1-27, . . . , 1-33. The reason is that the amplitude of the signals applied to these input terminals is generally so small that a sufficient S/N ratio cannot be easily obtained when the input signal is taken out from the pad of the address input terminal. In the case in which a sufficient S/N ratio is guaranteed, however, the signal may be input directly from the pad of the address input terminal.

Further, the input terminal test circuit unit shown in FIG. 8 includes a NOR gate 1-34 in the last stage.

Now, the operation of the circuit shown in FIG. 8 will be explained. When the "H" level second test mode signal TEST2 is supplied to the inverter 1-1, the input terminal test circuit unit is activated to assume the assume second test mode. In the case in which the nodes n1 and n2 at the two input terminals of the NOR gate (NOR1) in the second stage are both "L" level, an "L" level signal is transmitted to the NOR gate 1-16 in the next stage through the inverter (INV1) 1-11. At the same time, the "L" level signal is transmitted to the gate of the nMOS transistor (TR1) 1-14 through the NAND gate (NAND1) 1-12 and the inverter (INV2) 1-13, thereby turning off the nMOS transistor 1-14.

In the case in which one of the nodes n1 and n2 is at "H" level and the other is at "L" level, on the other hand, the output node n3 of the inverter (INV1) turns from "L" level to "H" level. Nevertheless, the transistor (TR1) remains off and the node 4 is kept at "H" level.

In the case in which both the nodes n1 and n2 are at "H" level, in contrast, the "H" level signal is transmitted to the NOR gate 1-16 in the next stage through the inverter 1-11. In the process, the nMOS transistor 1-14 turns on and the node n4 is reduced to "L" level.

In the case in which the input terminals for the addresses A0 to A4 to Am and all the input signals including the clock CLK, the command signals and the data mask signal DQM are at "L" level, the node n5 rises to "H" level and the nMOS transistor 1-38 turns on so that the node n4 is reduced to "L" level.

In the case in which only one of these input terminals is "H" while all the other terminals are "H", on the other hand, the transistors 1-14, 1-20, . . . , 1-37, 1-38 are all maintained in an off state, and therefore the node n4 remains at "H" level. Further, in the case in which at least two input terminals are at "H" level while the other terminals are at "L" level, e.g., in the case in which the address input terminal (A0) and the address input terminal (A1) are at "H" level, the transistor 1-14 turns on so that the node n4 is reduced to "L" level.

In view of the foregoing fact, in the case in which only one of a plurality of input terminals of the second group is at "H" level while the remaining input terminals are at "L" level, the node n4 rises to "H" level and the test result output signal TSD-ADD (TSD1) rises to "H" level. In other words, it follows that the test ends in a success for the terminals of the second group.

In the case in which all the input terminals are at "L" level, or two or more than two terminals of the input terminals are at "H" level on the other hand, the node n4 turns to "L" level and so does the test result output signal TSD-ADD. Thus, the test for the terminals of the second group proves a failure. In the case in which any one of the transistors 1-14, 1-20, . . . , 1-37, 1-38 turns on to reduce the node n4 to "L" level, the pMOS transistor 1-2 of the inverter is in an on state, and tries to raise the level of the node n4. The level of the node n4, however, can be reduced to a value lower than the input threshold value of the inverter 1-4 by increasing the ratio between the channel length and the channel width of the nMOS transistor 1-2 for an increased a resistance value in an on state of the transistor 1-2 or, as shown in FIG. 8, by suppressing the flow of the current from the power supply at the high voltage side into the node n4 with a resistor inserted at the drain side of the transistor 1-2.

Figure 9:
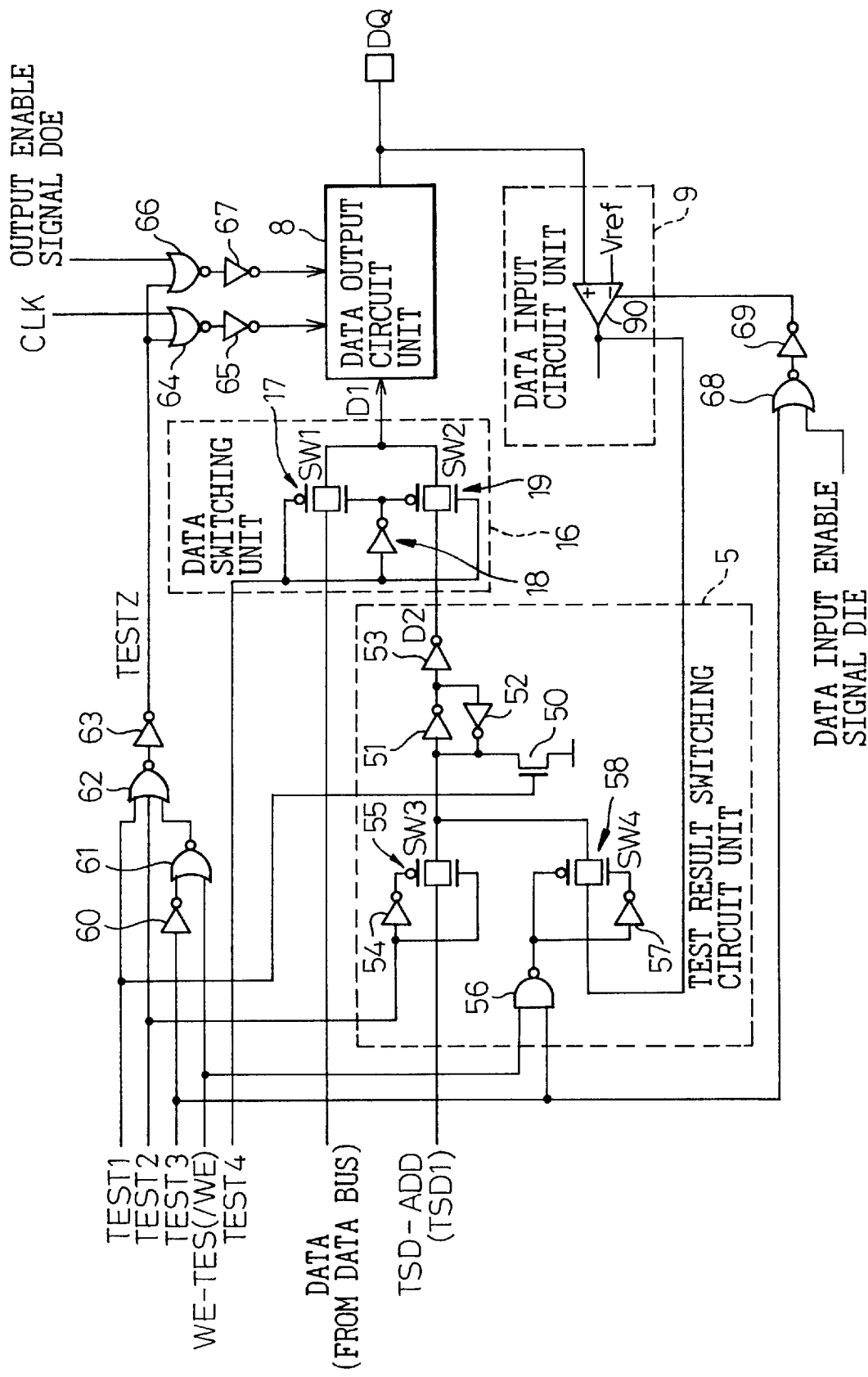
FIG. 9 is a circuit diagram showing a specific example of the configuration of the test data switching circuit unit and the data input/output buffer of FIG. 1.
Figure 10:
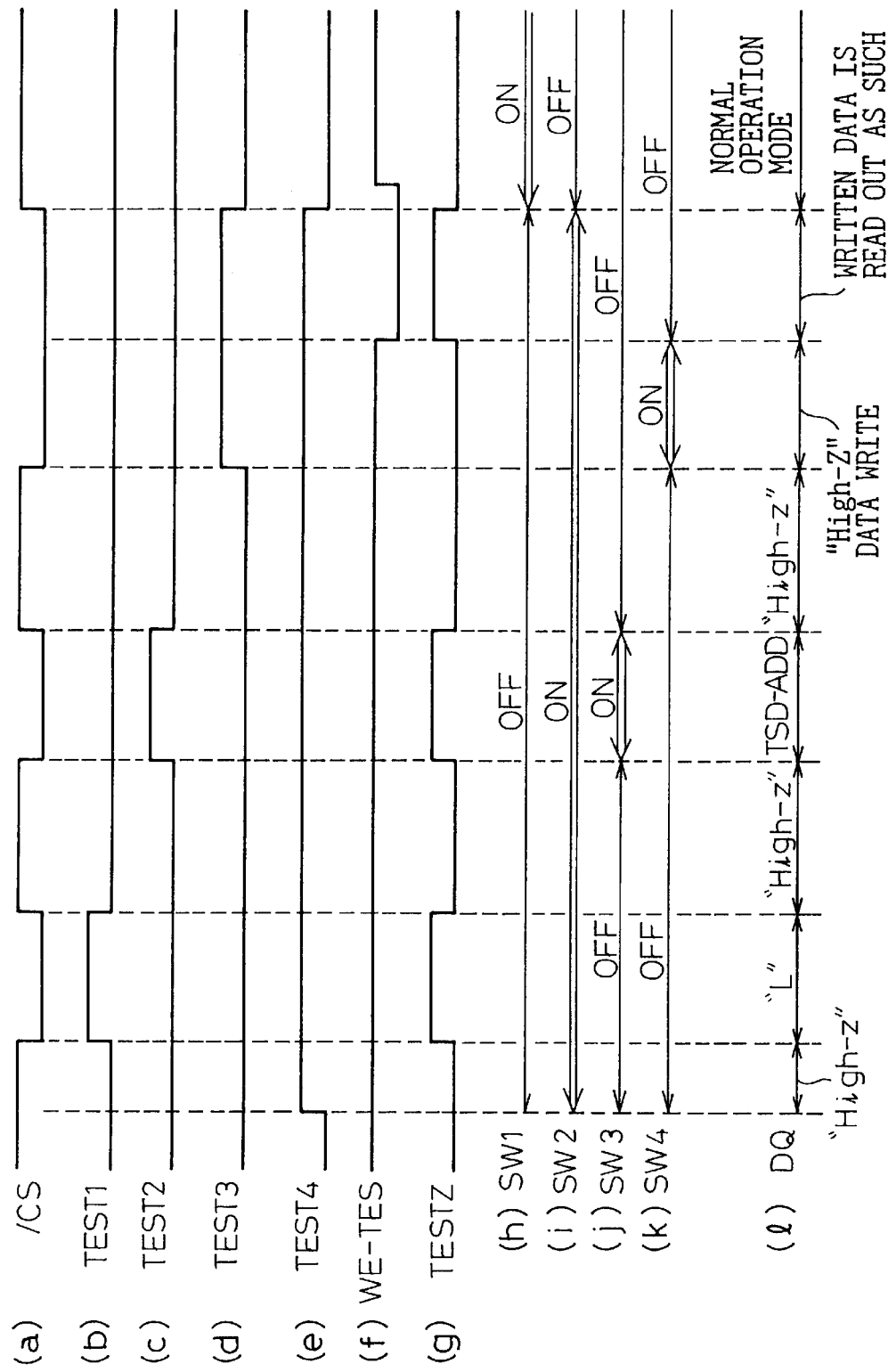
FIG. 10 is a timing chart for explaining the operation of the test data switching circuit unit and the data input/output buffer of FIG. 9.

FIG. 9 is a circuit diagram showing a specific example of the configuration of the test data switching circuit unit 5, the data switching unit 15 and the data input/output buffer 6 of FIG. 1. FIG. 10 is a timing chart for explaining the operation of the test data switching circuit unit and the data input/output buffer of FIG. 9.

The data switching unit 16 in the data input/output buffer 6 is configured so that the test signal and the normal output data signal are switched to each other by the test mode switching signal TEST4 and output to the data output circuit unit 8. More specifically, the data switching unit 16 includes two transfer switches 17, 19 (SW1 and SW2) adapted to be activated (on state) and deactivated (off state) in accordance with the test mode switching signal TEST4 and an inverter 18 for inverting the polarity of the test mode switching signal TEST4.

As long as the test mode prevails (TEST4="H"), the transfer switch 19 turns on so that the data D2 from the test data switching circuit unit 5 is transmitted as data D1 to the data output circuit unit 8. In the case in which the normal operation mode is prevailing (TEST4="L"), on the other hand, the transfer switch 17 turns on so that the data DATA is transmitted from the data bus to the data output circuit unit 8 as data D1. This data output circuit unit 8 has the function of sending out either one of the data from the data test circuit and the data from the data bus by way of the data input/output terminals DQ0 to DQn (DQ). The signal sent out by way of the data input/output terminals DQ from the data output circuit unit 8 is connected to the input terminal of the data input circuit unit 9. When the third test mode prevails (TEST3="H"), the data input circuit becomes an enable state by means of the output ("H" level) of the inverter so that the test input data applied to the data input/output terminals DQ is output to the test data switching circuit unit 5.

In response to the first, second and third test mode signals TEST1, TEST2 and TEST3 and the write enable signal /WE, the inverters 60, 63 and the NOR gates 61, 62 generate a signal TESTZ. This signal TESTZ causes data from the test circuit to be output from the data output circuit unit 8 asynchronously with the clock CLK when the test data are output in the first, second or third test mode. The signal TESTZ is connected to one of the terminals of each of the NOR gates 64, 66, and the output signals of the NOR gates 64, 66 are input to the data output circuit unit 8 through the inverters 65, 67, respectively.

The test data switching circuit unit 5 shown in FIG. 9 is the one for selecting which the test result is to be output as the data D2 in accordance with the first, second and third test mode signals TEST1, TEST2 and TEST3.

More specifically, the test data switching circuit unit 5 includes a nMOS transistor 50 supplied with the first test mode signal TEST1, a latch circuit unit having a pair of inverters 51, 52 for holding the test result in the first test mode, an inverter 53 connected to the output side of the latch circuit unit, an inverter 54 supplied with the second test mode signal TEST2 and a transfer switch 55 (SW3). Further, the test data switching circuit unit 5 includes a NAND gate 57 supplied with the third test mode signal TEST3 and the write enable signal /WE (WE-TES), an inverter 57 connected to the output of the NAND gate 56, and a transfer switch 58 (SW4). This transfer switch 58 is supplied with the signal sent out from the comparator 90 of the data input circuit unit 9. Further, the third test mode signal TEST3 is input to the NOR gate 68 together with the data input enable signal DIE. The signal output from this NOR gate 68 is supplied to the comparator 90 in the data input circuit unit 9 through the inverter 69.

Now, the operation of the test data switching circuit unit 5 and the data input/output buffer 6 of FIG. 9 will be explained with reference to the timing chart of FIG. 10.

When the power supply voltage is applied and the starter signal (STARTQ) rises to "H" level as shown in the portions (a), (e), (h) and (i) of FIG. 10, the test mode switching signal TEST4 rises to "H" level. As a result, the transfer switch 17 (SW1) in the data switching unit 16 turns off while the transfer switch 19 (SW2) turns on. Thus, the test signal instead of the normal output data signal is applied to the input terminal of the data output circuit unit. In the process, the "H" level chip select signal /CS is supplied to all the chips thereby to reset the memory device.

Then, as shown in the portion (b) of FIG. 10, upon application of the "L" level chip select signal /CS, the first test mode is entered. As long as the contact between the power supply terminals (VCCQ, VSSQ) and the chip select terminal (/CS) is satisfactory, the first test mode signal TEST1 rises to "H" level. In this case, the nMOS transistor 50 turns on, and the output level of the latch circuit unit including a pair of the inverters 51, 52 rises to "H" level. In the process, TEST2="L" and the transfer switch 55 (SW3) is in an off state, and therefore regardless of the level of the test result output signal TSD-ADD (TSD1), the "L" level data D2 is output from the inverter 53 of the test data switching circuit unit 5, while the "L" level test data is output from the data output circuit unit 8. By the way, as long as the first test mode prevails, the TESTZ signal is at "H" level. Therefore, both the NOR gates 64, 66 output a "L" level signal regardless of the level of the clock CLK and the output enable signal DOE, with the result that the data output circuit unit becomes an enable state regardless of the clock signal CLK (portion (l) of FIG. 10).

Then, the "H" level chip select signal /CS is supplied again thereby to finish the first test (TEST1="L"). At the same time, TESTZ becomes "L" level, so that the clock CLK and the output enable signal DOE are supplied to the data output circuit unit. Thus the output enable signal DOE is reduced to an inactive level, with the result that the output level of the data output circuit unit 8 (level of the data (DQ)) becomes a "High-Z" (high impedance state) (portion (l) of FIG. 10).

Then, as shown in the portions (c) and (j) of FIG. 10, the second "L" level chip select signal /CS is supplied and the second test mode signal TEST2 becomes "H" level, followed by assuming the second test mode. In the second test mode, the contact test is carried out on the input terminals other than the chip select terminal. In this case, the test mode switching signal TESTZ becomes "H" level, and the data output circuit unit 8 is activated regardless of the clock CLK. Also, the transfer switch 55 (SW3) is turned on by the second test mode signal TEST2, and the test result output signal TSD-ADD from the input terminal test circuit unit of FIG. 8 is output to the data input/output terminals DQ through the latch circuit unit including a pair of inverters 51, 52, the transfer switch (SW2) and the data output circuit unit 8.

Then, the "H" level chip select signal /CS is supplied again thereby to finish the second test (TEST2="L"). At the same time, the output level of the data output circuit unit 8 (the level of the data DQ) becomes "High-Z" (portion (1) of FIG. 10).

Then, as shown in the portions (d), (f) and (k) of FIG. 10, the third "L" level chip select signal /CS is supplied and the third test mode signal TEST3 is raised to "H" level thereby to assume the third test mode. In the third test mode, the contact test of the I/O terminals is carried out. Due to this third test mode signal TEST3, the output of the inverter 69 rises to "H" level, the data output circuit unit 8 is activated, and the test data applied to the data input/output terminals DQ is output to the test data switching circuit 5. Since the write enable signal /WE (WE-TES) is at "H" level, the transfer switch 58 (SW4) turns on, so that the output of the data input circuit unit 9 is latched in the latch circuit unit including the inverters 51, 52 through the transfer switch (SW4). At the same time, the output of the NOR gate 61 is at "L" level and so TESTZ="L". Therefore, the inactive output enable signal DOE is input to the data output circuit unit 9. Thus, the output of the data output circuit unit remains at "High-Z". The data written in this way is held in the latch circuit unit including a pair of the inverters 51, 52.

After that, the write enable signal /WE is reduced to "L" level. The "H" level signal TESTZ is generated, and the data output circuit unit 8 is activated asynchronously with the clock CLK. The test data held in the latch circuit unit including the inverters 51, 52 is output to the data input/output terminal DQ through the transfer switch (SW2) and the data output circuit unit 8 (portion (g) of FIG. 10). In the process, the transfer switch 58 (SW4) is in an off state.

Then, the "H" level chip select signal /CS is supplied again thereby to finish the third test. At the same time, as shown in the portion (e) of FIG. 10, the test mode switching signal TEST4 is reduced to "L" level and the transfer switch 17 (SW1) turns on. Thus, in place of the test result output, the normal output data becomes ready to be supplied to the data output circuit unit.

Figure 11:
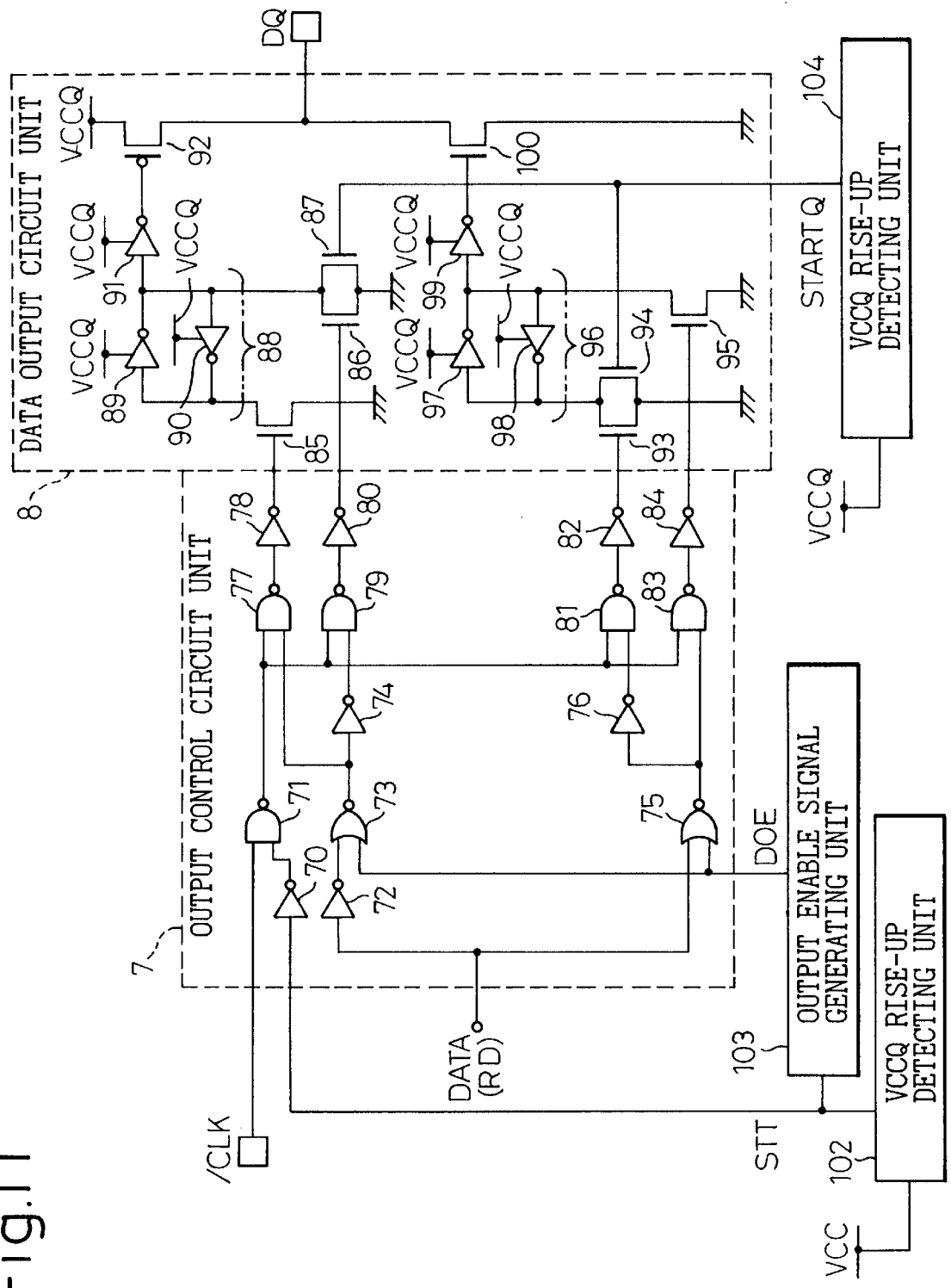
FIG. 11 is a circuit diagram showing an example of the configuration of the data output circuit unit used as an embodiment of the present invention.

FIG. 11 is a circuit diagram showing an example of the configuration of the data output circuit unit used in an embodiment of the present invention. A data output circuit unit most suitable for an embodiment of the invention of FIG. 10 and circuits related to the data output circuit unit are shown.

The data output circuit unit 8 shown in FIG. 11 can secure the output level of "High-Z" indicating a high impedance, even in the case in which the power supply terminal for supplying the power supply voltage VCCQ at the high voltage side and the power supply voltage VSSQ at the low voltage side dedicated to the data output circuit unit have a superior contact while the power supply terminal for supplying the power supply voltage VCC at the high voltage side and the power supply voltage. VSS at the low voltage side of other internal circuits have a defective contact. The use of this data output circuit for the test circuit according to the present invention makes it possible to eliminate an adverse effect on the test of other memory devices even in the case influence a defective contact occurs of the power supply terminals (VCC, VSS).

In FIG. 11, a VCC rise-up detection circuit 102 is for monitoring the rise of the power supply voltage VCC at the high voltage side of the internal circuits other than the data output circuit unit. This VCC rise-up detection circuit 102, upon detection of a rise of the power supply voltage VCC for the internal circuits, outputs a pulse-shaped VCC rise detection signal STT.

Further, in FIG. 11, an output enable signal generating circuit 103 is provided for generating an output enable signal DOE for controlling the activity/inactivity of the data circuit unit. The output enable signal DOE turns to "H" level when the VCC rise detection signal STT is output from the VCC rise-up. detection circuit 102 (whereby the data input/output terminal DQ becomes "High-Z"). After that, when the read command signal is fetched and the data output cycle determined by the CAS latency is attained, the output enable signal DOE turns to "L" level (whereby-the read data (DATA) of the data output circuit unit becomes ready to be output to the data input/output terminal DQ.)

Further, in FIG. 11, a VCCQ rise-up detection circuit 104 is provided for monitoring the power supply voltage VCCQ dedicated to the data output circuit unit. This VCCQ rise-up-detection circuit 104, upon detection of the rise of the power supply voltage VCCQ dedicated to the data output circuit unit, outputs a pulse-shaped VCCQ rise detection signal, i.e., the starter signal STARTQ (during which the data input/output terminal DQ is raised to "High-Z" state). As a result, even in the case in which at least one of VCC and VCCQ rises earlier than the other, the data input/output terminal DQ can be maintained in a "High-Z" state.

The output control circuit unit 7 of FIG. 11 includes an inverter 70 for inverting the VCC rise detection signal STARTQ and a NAND gate 71 for receiving the negative logic clock /CLK output from the clock buffer 101 and the output signal of the inverter 70.

Further, in the output control circuit unit 7 of FIG. 11, numeral 72 designates an inverter for inverting the read data DATA (read data RD), numeral 73 a NOR gate for receiving the output signal of the inverter 72 and the output enable signal DOE, and numeral 74 an inverter for inverting the output signal of the NOR circuit 73.

Furthermore, in the output control circuit unit 7 of FIG. 11, numeral 75 designates a NOR gate for receiving the read data RD and the output enable signal DOE, and numeral 76 an inverter for inverting the output signal of the NOR gate 75. Further, numeral 77 designates a NAND gate for receiving the output signal of the NAND gate 71 and the output signal of the NOR gate 73, and numeral 78 an inverter for inverting the output signal of the NAND gate 77. Further, numeral 79 designates a NAND gate for receiving the output signal of the NAND gate 71 and the output signal of the inverter 74, and numeral 80 an inverter for inverting the output signal of the NAND gate 79.

Also, in the output control circuit unit 7 of FIG. 11, numeral 81 designates a NAND gate for receiving the output signal of the NAND gate 71 and the output signal of the inverter 56, numeral 82 an inverter for inverting the output signal of the NAND gate 81, numeral 83 a NAND gate for receiving the output signal of the NAND gate 71 and the output signal of the NOR gate 75, and numeral 84 an inverter for inverting the output signal of the NAND gate 83.

Incidentally, the inverters 70, 72, 74, 76, 78, 80, 82, 84, the NAND gates 71, 77, 79, 81, 83 and the NOR gates 73, 75 are supplied with the power supply voltage VCC for the internal circuits other than the data output circuit unit.

Now, the configuration of the data output circuit unit 8 most suitable for an embodiment of the present invention will be explained in detail. The data output circuit unit 8 of FIG. 11 includes a nMOS transistor 85 with the source thereof connected to the ground and the gate thereof connected to the output terminal of the inverter 78 and constituting a switching device with on/off operations thereof controlled by the output signal of the inverter 78; and a nMOS transistor 86 with the source thereof connected to the ground and the gate thereof connected to the output terminal of the inverter 80 and constituting a switching device with on/off operations thereof controlled by the output signal of the inverter 80. The data output circuit unit 8 further includes a nMOS transistor 87 with the source thereof connected to the ground and constituting a switching device adapted to be turned on by the VCCQ rise detection signal (STARTQ).

Further, the data output circuit unit 8 of FIG. 11 includes a latch circuit 88 having a pair of inverters 89, 90. In this latch circuit 88, the junction point between the output terminal of the inverter 90 and the input terminal of the inverter 89 is connected to the drain of the nMOS transistor 85, and the junction point between the output terminal of the inverter 89 and the input terminal of the inverter 90 is connected to the drains of the nMOS transistors 86, 87. The data output circuit unit 8 further includes an inverter 91 for inverting the output signal of the inverter 89; and a pMOS transistor 92 with the source thereof connected to the power supply line for supplying the power supply voltage VCCQ, the drain thereof connected to the data input/output terminal DQ and the gate thereof connected to the output terminal of the inverter 91, and with on/off operations thereof controlled by the output signal of the inverter 91.

Further, the data output circuit unit 8 of FIG. 11 includes a nMOS transistor 93 with the source thereof connected to the ground and the gate thereof connected to the output terminal of the inverter 82, and constituting a switching element with on/off operations thereof controlled by the output signal of the inverter 82. The data output circuit unit 8 further includes a nMOS transistor 94 with the source thereof connected to the ground and adapted to be turned on by the VCCQ rise detection signal (STARTQ). Further, the data output circuit unit 8 includes a nMOS transistor 95 with the source thereof connected to the ground and the gate thereof connected to the output terminal of the inverter 84 and on/off operations thereof controlled by the output signal of the inverter 84.

Furthermore, the data output circuit unit 8 of FIG. 11 includes a latch circuit unit 96 having a pair of inverters 97, 98. In this latch circuit unit 96, the junction point between the output terminal of the inverter 98 and the input terminal of the inverter 97 is connected to the drain of the nMOS transistors 93, 94, and the junction point between the output terminal of the inverter 97 and the input terminal of the inverter 98 is connected to the drain of the nMOS transistor 95. Further, the data output unit 96 includes an inverter 99 for inverting the output signal of the inverter 97, and a nMOS transistor 100 with the drain thereof connected to the data input/output terminal DQ, the source thereof grounded, and the gate thereof connected to the output terminal of the inverter 99 and on/off operations thereof controlled by the output signal of the inverter 99.

Now, the operation of this data output circuit unit will be explained.

The inverters 89, 90, 91, 97, 98, 99 are supplied with the power supply voltage VCCQ dedicated to the data output circuit unit.

In the circuit configuration described above, when power is switched on and the power supply voltage VCC rises, the VCC rise detection circuit 102 outputs a VCC rise detection signal STT.

As a result, the output of the inverter 70 turns to "L" level, and the output of the NAND gate 71 turns to "H" level, so that the NAND gate 77 functions as an inverter of the output signal of the NOR gate 73, the NAND gate 79 functions as an inverter of the output signal of the inverter 74, the NAND gate 81 functions as an inverter of the output signal of the inverter 76, and the NAND gate 83 functions as an inverter of the output signal of the NOR gate 75.

Further, in this-case, the output enable signal DOE turns to "H" level, and the read data (DATA) transmission is interrupted by the NOR gates 73 and 75. The output level of the NOR gate 73 turns to "L" level, the output level of the NAND gate 77 turns to "H" level, the output level of the inverter 78 turns to "L" level, and the nMOS transistor 85 turns off. At the same time, the output level of the inverter 74 turns to "H" level, the output level of the NAND gate 79 turns to "L" level, the output level of the inverter 80 turns to "H" level, and the nMOS transistor 86 turns on.

As a result, the input level of the inverter 91 turns to "L" level, the output level of the inverter 91 turns to "H" level, and the pMOS transistor 92 turns off.

On the other hand, the output level of the NOR gate 75 turns to "L" level, the output level of the inverter 76 turns to "H" level, the output level of the NAND gate 81 turns to "L" level, the output level of the inverter 82 turns to "H" level, and the nMOS transistor 93 turns on. At the same time, the output level of the NAND gate 83 turns to "H" level, the output level of the inverter 84 turns to "L" level, and the nMOS transistor 95 turns off.

As a result, the input level of the inverter 97 turns to "L" level, the output level of the inverter 97 turns to "H" level, the output level of the inverter 99 turns to "L" level, and the nMOS transistor 100 turns off.

In this way, the data output circuit unit 8 is controlled in such a manner that when the power supply voltage VCC for the internal circuits other than the data output circuit unit rises at the time of starting up a power supply, the output control circuit unit 7 is controlled by the VCC rise detection signal STT and the output enable signal DOE, so that the pMOS transistor 92 turns off and the nMOS transistor 100 turns off.

Even in the case in which the power supply voltage VCC for the internal circuits other than the data output circuit unit rises earlier than the power supply voltage VCCQ dedicated to the data output circuit unit, therefore, the data input/output terminal for outputting the data DQ can be set in high impedance state.

In the case in which the power supply voltage VCCQ dedicated to the data output circuit unit rises at the time of starting up a power supply, in contrast, the VCCQ rise detection circuit 104 outputs the VCCQ rise detection signal (STARTQ).

As a result, the nMOS transistor 87 turns on, the input level of the inverter 91 turns to "L" level, the output level of the inverter 91 turns to "H" level, and the PMOS transistor 92 turns off.

Also, the nMOS transistor 94 turns on, he input level of the inverter 97 turns to "L" level, the output level of the inverter 97 turns to "H" level, and the output level of the inverter 99 turns to "L" level, and the nMOS transistor 100 turns off.

As described above, in the case in which the power supply voltage VCCQ dedicated to the data output circuit unit rises at the time of starting up a power supply, the output control circuit unit 7 is controlled by the VCCQ rise detection signal (STARTQ), the PMOS transistor 92 turns off and the nMOS transistor 100 turns off.

Even in the case in which the power supply voltage VCCQ dedicated to the data output circuit unit rises earlier than the power supply voltage VCC for the internal circuits other than the data output circuit unit, the data input/output terminal can be set to a high impedance state.

After the power supply voltage VCC for the internal circuits dedicated to the data output circuit unit rises, the VCC rise detection signal STT falls, the output level of the inverter 70 turns to "H" level, and the NAND gate 71 functions as an inverter of the clock signal (the clock /CLK in an active low in this case).

After the power supply voltage VCCQ dedicated to the data output circuit unit rises, on the other hand, the VCC rise detection signal (STARTQ) falls and the nMOS transistors 87, 94 turn off.

With the circuit configuration shown in FIG. 11, even in the case in which one of the power supply voltage VCCQ dedicated to the data output circuit unit and the power supply voltage VCC for the internal circuits other than the data output circuit unit rises earlier than the other when an electric power is switched on, the data input/output terminal can be set to a high impedance state. It is thus possible to avoid the through current flowing between the memory device including the data output circuit unit and the other SDRAM (synchronous DRAM) connected to the same external data bus, thereby reducing a power consumption.

With the data output circuit unit shown in FIG. 11, on the other hand, the provision of the latch circuits 88 and 96 can avoid the flow of a through current between the memory device and the other SDRAM connected to the same external data bus even in the case in which there is a relatively long time lag between the rise time of the power supply voltage VCCQ dedicated to the data output circuit unit and the rise time of the power supply voltage VCC for the internal circuit other than the data output circuit unit.

After the rise of the power supply voltages VCC, VQQ, the VCC rise detection signal STT turns to "L" level. Before the lapse of a predetermined CAS latency after the arrival of the read data from the internal circuit at the output control circuit unit, however, the output enable signal DOE remains at "H" level. Thus, the read data DATA is interrupted by the NOR gates 73 and 75. Since the output of the inverter 70 turns to "H" level, on the other hand, the NAND 71 outputs an inverted clock signal (/CLK). Under this condition, the transistors 85 and 95 are kept off. The transistors 86 and 93, on the other hand, are turned on/off by the clock signal (/CLK). The input to the inverters 91 and 97, however, remains in "L" level in spite of on/off operations thereof. Thus, the gate of the pMOS transistor 92 is kept at "H" level, the gate of the nMOS transistor 100 is kept at "L" level, and the data input/output terminal DQ is kept at a "High-Z" state.

With the arrival of the read data output period, the output enable signal DOE turns to "L" level, and the read data (DATA) is output to the data input/output terminal DQ through the output control circuit unit and the data output circuit unit. In synchronism with the clock signal (/CLK), i.e. with the turning of the clock signal (/CLK) to "L" level during the period in which the output enable signal is at "L" level, the NAND gates 77, 79, 81, 83 are in enable states, and the read data DATA is output to the data output circuit unit. When the read data DATA turns to "H" level, the data input/output terminal turns to "H" level, whereas when the read data DATA turns to "L" level, the data input/output terminal turns to "L" level. Then, with the turning of the clock signal (/CLK) to "H" level, the outputs of the NAND gates 77, 79, 81, 83 are fixed to "H" level, the transistors 85, 86, 93, 95 turn off, and the output state of the data output terminal is maintained by the data held in the latch circuit units 88, 96.

In the embodiments described above, the terminals of the memory device are divided into three groups of terminals to carry out the test for checking the state of the contact of the terminals. According to this invention, however, the terminals of the memory are not necessarily divided into these three groups of terminals, but may be divided into an arbitrary number of groups of terminals with equal effect for the purpose of testing. For example, the terminals of the memory device can be divided into two groups, four groups or more than four groups for testing.

It will thus be understood from the foregoing description that, according to some typical embodiments of the present invention, first, the first operation mode for the terminal connection test is assumed simply by applying a specific level of signal to the chip select signal (/CS) with an electric power being switched on. In this first operation mode, the state of the contact of a specific terminal (VCCQ, VSSQ, /CS) can be determined. Therefore, the terminal connection test can be carried out with an activation sequence simpler than in the prior art without the need for a terminal dedicated to a terminal connection test circuit.

Second, according to some typical embodiments of the present invention, when an electric power is switched on and a signal of a specific level is applied to a chip select signal terminal (/CS), the terminal connection test mode is assumed, and when the signal applied to a specific terminal (/CS) is increased and decreased a predetermined number of times, the normal operation mode is assumed, but the test mode is never restored subsequently. Therefore, the test such as the terminal contact check can be performed with a simple method, as compared with the prior art without affecting the condition of the normal operations.

Third, according to some typical embodiments of the present invention, since a chip select terminal is used as the specific terminal, the test can be carried out with a simpler method than in the prior art by taking advantage of the existing terminals.

Fourth, according to some typical embodiments of the present invention, a plurality of types of terminal connection tests can be carried out while switching the test types in accordance with the number of times the chip select signal of active level is applied to the chip select terminal from the start of the test mode. Therefore, a plurality of types of test can be carried out in a simpler sequence than in the prior art by taking advantage of the existing terminals.

Fifth, according to some typical embodiments of the present invention, the test circuit is set in a state ready for selection a predetermined number of times by applying the chip select signal to the chip select terminal, after which the test circuit is set to a non-select state. Therefore, the test can be carried out with a simpler method than in the prior art without affecting the condition of the normal operations.

Sixth, according to some typical embodiments of the present invention, the contact test of the terminals is carried out electrically by the use of a terminal connection test circuit mounted on a chip, and therefore, as compared with the conventional visual test, the contact check of the terminals can be performed with a simple method.

Seventh, according to some typical embodiments of the present invention, a plurality of types of test are carried out, including a first test for confirming the state of the contact of the chip select terminal and the power supply terminal, a second test for checking the state of the contact of any input terminals other than the chip select terminal and a third test for checking the state of the contact of a data input/output terminal. In this way, a plurality of types of the tests can be carried out efficiently in a sequence simpler than in the prior art.

Eighth, according to some typical embodiments of the present invention, the chip select terminal is connected to the power supply line through a load such as a resistor. Even in the case in which the chip select terminal is defectively connected, therefore, a chip select signal of a predetermined level can be ensured so as to avoid an adverse effect on the test of other memory devices.

Ninth, according to some typical embodiments of the present invention, the test mode is assumed by detecting the application of a power supply voltage to the power supply terminal used exclusively for the data output circuit for outputting the test result. Even in the case in which the power supply terminal for supplying a power supply voltage to any circuit other than the data output circuit unit is defectively contacted, therefore, the test of the other memory devices is not adversely affected.

What is claimed is:

1. A method of testing a semiconductor device having a first group of terminals and a second group of terminals, comprising the steps of:

applying a power supply voltage to said semiconductor device;

carrying out a first test for checking a state of a contact of said first group of terminals in response to a transition of a chip select signal supplied to said semiconductor device; and carrying out a second test for checking the state of the contact of said second group of terminals in response to another transition of said chip select signal.

2. A testing method according to claim 1, further comprising the step of:

repeating the operation of activating said chip select signal as many times as the number of the terminal groups of said semiconductor device after switching on power.

* * * * *